(12) United States Patent
Houldsworth et al.

(10) Patent No.: US 7,259,572 B2
(45) Date of Patent: Aug. 21, 2007

(54) METHOD AND APPARATUS FOR DETECTING IMPEDANCE

(75) Inventors: John Houldsworth, Reston, VA (US); Nigel A. Jones, New Market, MD (US)

(73) Assignee: PowerPrecise Solutions, Inc., Herndon, VA (US)

( * ) Notice: Subject to any disclaimer, the term of this patent is extended or adjusted under 35 U.S.C. 154(b) by 0 days.

(21) Appl. No.: 11/151,222

(22) Filed: Jun. 14, 2005

(65) Prior Publication Data

US 2005/0275408 A1 Dec. 15, 2005

Related U.S. Application Data

(60) Provisional application No. 60/579,729, filed on Jun. 14, 2004.

(51) Int. Cl.
*G01R 27/26* (2006.01)
*G01R 31/08* (2006.01)
*H02J 7/00* (2006.01)

(52) U.S. Cl. .............. 324/677; 324/525; 320/132

(58) Field of Classification Search ........... 324/677, 324/711, 427, 435, 428, 430, 525; 320/132
See application file for complete search history.

(56) References Cited

U.S. PATENT DOCUMENTS

| | | | | |
|---|---|---|---|---|
| 3,711,770 A | * | 1/1973 | Wilson | ............ 324/711 |
| 4,207,514 A | * | 6/1980 | Klein | ............ 320/134 |
| 4,539,516 A | | 9/1985 | Thompson | |
| 4,710,720 A | | 12/1987 | Weiner | |
| 4,987,372 A | * | 1/1991 | Ofori-Tenkorang et al. | 324/705 |
| 5,221,888 A | * | 6/1993 | Moody | ............ 323/315 |
| 5,349,282 A | * | 9/1994 | McClure | ............ 320/136 |
| 5,372,898 A | * | 12/1994 | Atwater et al. | ............ 429/90 |
| 5,444,378 A | * | 8/1995 | Rogers | ............ 324/428 |
| 5,659,240 A | | 8/1997 | King | |
| 5,661,042 A | | 8/1997 | Fang et al. | |
| 6,014,141 A | * | 1/2000 | Klein | ............ 715/835 |
| 6,097,193 A | | 8/2000 | Bramwell | |
| 6,195,613 B1 | | 2/2001 | Roy et al. | |
| 6,396,298 B1 | * | 5/2002 | Young et al. | ............ 324/769 |
| 6,549,014 B1 | | 4/2003 | Kutkut et al. | |
| 6,967,483 B2 | | 11/2005 | Kwark | |

* cited by examiner

*Primary Examiner*—Anjan Deb
(74) *Attorney, Agent, or Firm*—DLA Piper US LLP

(57) ABSTRACT

A method and apparatus for detecting an impedance across a pair of terminals. A sensing circuit is AC coupled to the terminals which produces an output related to a time constant associated with the impedance.

31 Claims, 4 Drawing Sheets

METHOD AND APPARATUS FOR DETECTING IMPEDANCE

CROSS-REFERENCE TO RELATED APPLICATIONS

This application is related to and claims priority from provisional Patent Application Ser. No. 60/579,729 filed Jun. 14, 2004, the entire disclosure of which is incorporated by reference herein.

FIELD OF THE INVENTION

The invention relates generally to a method and apparatus for detecting impedance.

BRIEF DESCRIPTION OF THE DRAWINGS

A more complete appreciation of the various embodiments will be readily obtained by reference to the following detailed description when considered in conjunction with the accompanying drawings, wherein.

DETAILED DESCRIPTION OF SEVERAL EMBODIMENTS

Figure 1:
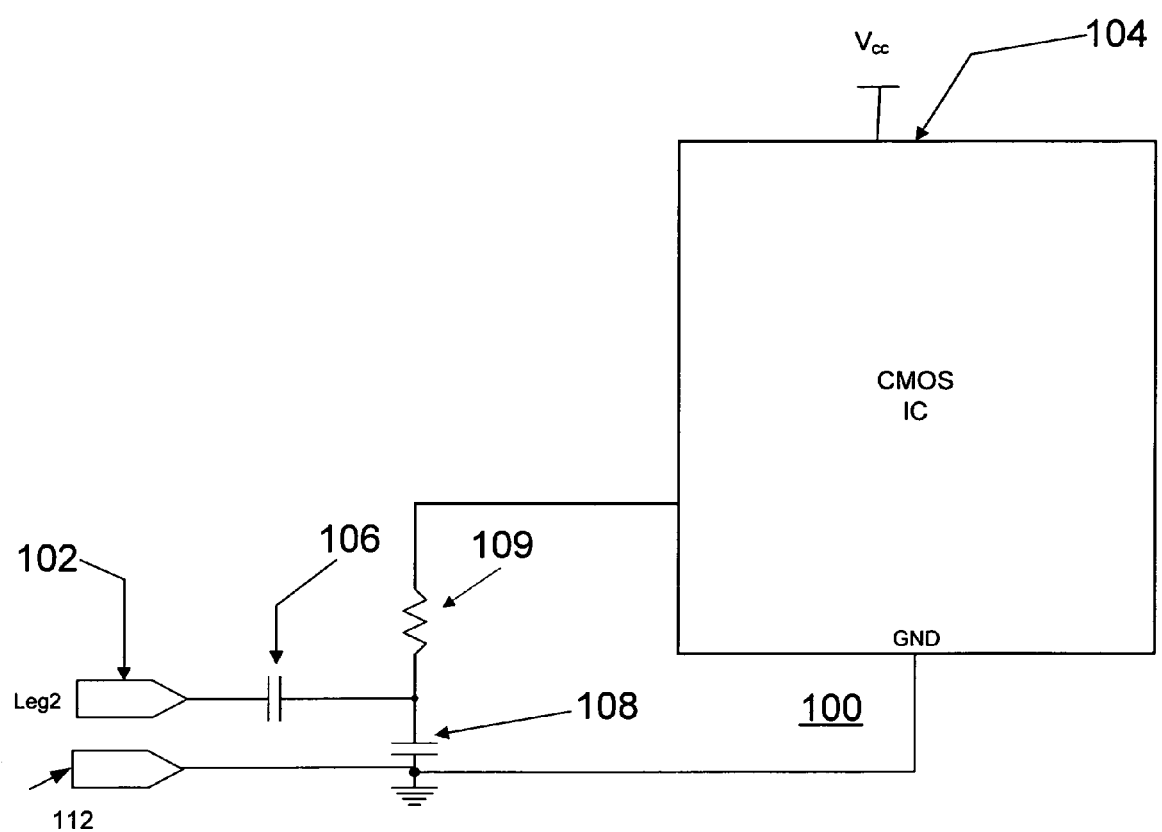
FIG. 1 illustrates a circuit diagram of a sensing circuit for controlling a battery pack SOC monitor according to embodiments of the invention.

Embodiments of the invention include apparatuses, systems and methods for detecting impedance. The invention can be used to receive data transmission in which data values are encoded by different impedance levels. The invention can detect the impedance levels to receive the data. Alternatively, the invention can be used in implementing the automatic activation and deactivation of a battery pack state-of-charge (SOC) monitor. Of course, the invention has numerous other applications as would be known to those skilled in the art. It should be understood that the apparatuses and methods described herein may be implemented by any combination of hardware, software and/or firmware.

The SOC monitor embodiment will be described in more detail below. In one embodiment, a battery management system comprises a dual-voltage battery pack, a state-of-charge monitor and a sensing circuit for automatically determining whether the battery pack is electrically connected to a load. The sensing circuit may include, for example, a CMOS circuit that controls the activation of the SOC monitor while consuming much less power than the SOC monitor. When activated, the SOC monitor determines the battery state of charge. The battery state of charge may then be displayed to a user. The SOC monitor consumes little or no power unless it is activated by the sensing circuit.

The term "battery pack" as used herein may represent any power source that may be employed to power a load. For example, a battery pack may be utilized to power such devices as, without limitation, a processor; a microprocessor; a personal computer, such as a laptop, palm PC, desktop or workstation; an electronic wired or wireless device, such as, for example, a telephone or electronic transceiver box; a cellular telephone; a personal digital assistant; an electronic pager and digital watch. In various embodiments, the battery pack may comprise, but is not limited to, a lithium, lithium-ion, nickel-metal hydride (NiMH) and/or nickel-cadmium (NiCad) battery pack.

In one embodiment, the battery pack is a dual-voltage battery pack containing two or more cell strings. As used herein a "cell string" comprises one or more battery cells. The cell string can be electrically independent or connected to another cell string. In one embodiment, two cell strings are electrically independent, but may be utilized as a pair in either series or parallel configuration (i.e. the two strings remain balanced in use). For example, two 12V cell strings in a dual-voltage battery pack may be configured in parallel/series for 12/24V operation. Typically, discharge rates over various applications for a dual-voltage battery pack range from 100 mA to 2.5 A per cell string.

If a battery pack embodiment includes a SOC monitor, then the power consumed by the SOC monitor must also be considered. This is particularly true if the battery pack is expected to 'sit on the shelf' (i.e. not be deployed) for a significant amount of time. A typical solution to this problem is to have the SOC monitor operate in two modes—shelf and active. In shelf mode, the objective is to minimize the power consumption of the SOC monitor. In active mode, the objective is for the SOC monitor to accurately measure parameters such as current, time and temperature in order to determine the SOC of the monitored battery pack.

In the various embodiments a sensing circuit detects when a battery pack is attached to a load without measuring the load current and automatically transitions the SOC monitor from a first dormant mode to a second active mode. In one embodiment, a SOC display for the battery pack may be viewed while the SOC monitor is in shelf mode while still permitting low power operation.

In one embodiment, a sensing circuit is provided which produces an output related to an impedance which changes value when a battery pack is connected to an external load and therefore, put in service. In one example, the sensing circuit may implement a change in time constant to sense connection. In another example, the sensing circuit may also apply logical filtering before latching a measurement result, as will be explained in further detail below.

In one embodiment, the SOC monitor has two fundamental operating states, namely, a first dormant or shelf mode and a second active mode. Further, it is possible that the SOC monitor may have a plurality of active mode settings based on, for example, the magnitude of the detected load. In shelf mode, it is desirable to minimize the power drain on the battery pack. In one embodiment, the shelf mode current draw of the SOC monitor is between 0 and about 10 μA. Therefore, in one embodiment, a reduced number of parameters may be monitored by the SOC monitor in shelf mode. For example, the SOC monitor may disable the measurement of current and temperature parameters when its operating state is in shelf mode. In active mode, the SOC monitor may measure parameters such as, but not limited to, time, temperature, load current and/or voltage. In one embodiment, the activated mode current draw is less than 100 μA.

For the sake of clarity, the battery pack described in the various embodiments herein contains two cell strings. However, one skilled in the art will note that the various embodiments may be adapted for monitoring the SOC of battery packs that employ a variety of configurations including those that contain one or a plurality of cell strings. As such, within a dual-string or dual-voltage battery pack, the two cell strings are typically connected together either in series or parallel only when an external load is electrically connected to the battery pack. In one embodiment, the sensing circuit monitors and detects the change in impedance between the two cell strings to determine whether the battery pack is connected to an external load. In response to this detection, the sensing circuit may cause the SOC monitor to switch from shelf mode to active mode. In one embodiment, the operation of the battery pack is dependent on the output of the sensing circuit such that, once activated, the load current and temperature are monitored with appropriate resolution and sample rate to determine the SOC to a desired accuracy which may be, for example, ±5%. Accuracy must be met for load currents in a desired range, such as, for example, a range of 50 mA to 2.5 Amps per cell string, wherein loads of less than 50 mA may register as 0 mA (no load).

FIG. 1 illustrates a smart activation sensing circuit 100 in accordance with the various embodiments. In FIG. 1, a node 102 marked "Leg2" is connected to a terminal of the second cell string of a dual-voltage battery pack (not shown). A capacitor 106 is used to AC couple the second cell string to a controller 104. A second capacitor 108 is connected between capacitor 106 and ground. Resistor 109 and capacitor 108, with or without capacitor 106 (depending on whether a load is connected across terminals 102 and 112) define one time constant when capacitor 106 is connected to a load and a different time constant when capacitor is not connected to a load. In one embodiment, the capacitance ratio between the first capacitor 106 and the second capacitor 108 is at least 100:1. As such, this capacitive coupling allows the controller 104 to measure the AC impedance between cell strings coupled to terminals 102 and 112 without constraining the DC potential of one string relative to the other. Capacitor 106 AC couples the controller 104 to terminal 102 at which the impedance is to be detected. The operation of the controller in various embodiments will be described in more detail below in reference to the circuit in FIG. 2.

Figure 2:
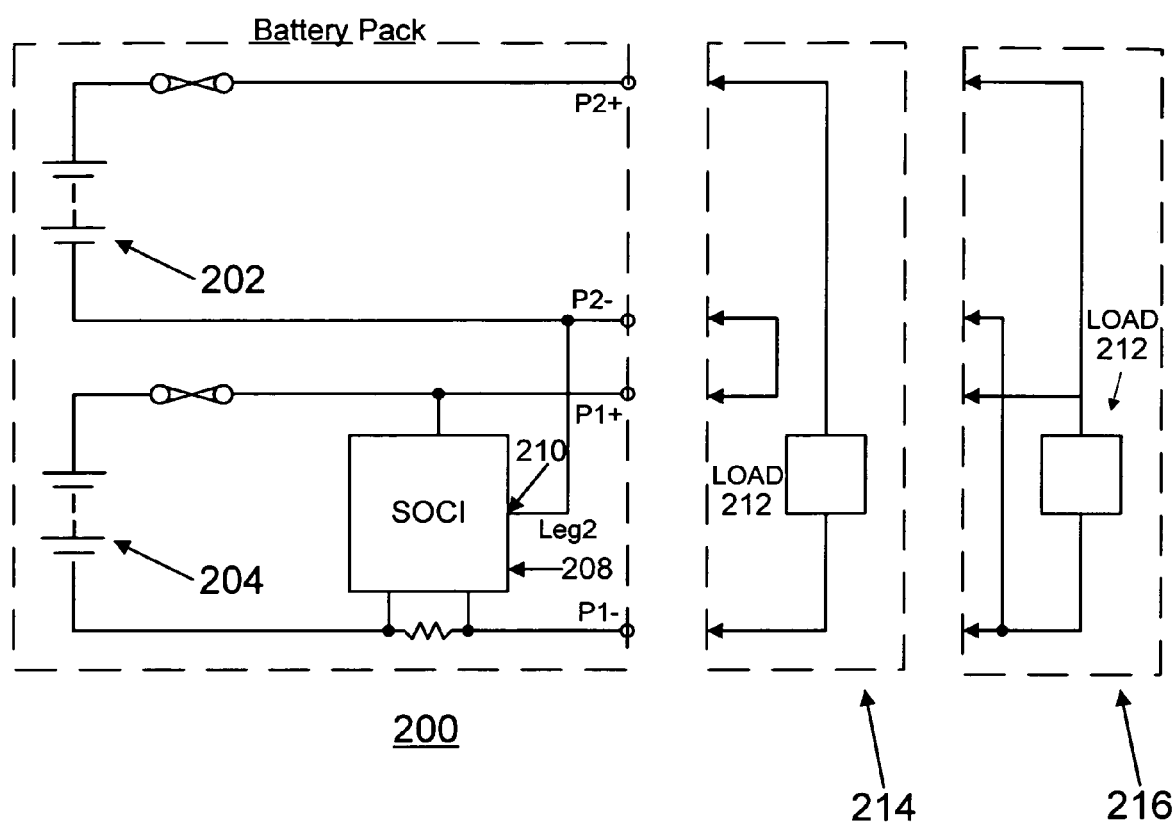
FIG. 2 illustrates a circuit diagram of a battery management system according to embodiments of the invention.

FIG. 2 illustrates a circuit diagram of a battery management system 200 according to embodiments of the invention. In one embodiment, the first and second cell strings, 202 and 204 respectively, of a battery pack are independent until they are connected to a load 212. The external load connection with the first and second cell strings may be in series (as indicated by reference numeral 214) or in parallel (as indicated by reference numeral 216). The circuitry should remain in a "dormant" state (shelf mode) until activated.

The sensing circuit 100 is integrated within the SOC monitor 208. Particularly, the SOC monitor, including controller 104, is powered from cell string 204. The Leg2 node 102 of the controller 104 is coupled to the "Leg2" node 210 of the SOC monitor 208, which, in turn, is connected to cell string 202. In one embodiment, the SOC monitor 208 may include conventional monitoring capabilities such as a means for monitoring the current draw of the battery pack utilizing, for example, a current integrator, as well as the impedance monitoring functionality of the controller 104. One skilled in the art will note that some or all of the functions of the controller 104 may be implemented internally or externally with respect to the SOC monitor 208 as desired. Further, the functions of the SOC monitor 208 may be implemented by one or more components as desired.

Referring back to FIG. 1, when the battery pack is connected to an external load, the two capacitors, 106 and 108, are effectively connected in parallel. In one embodiment, the capacitance of the RC circuit may be ~0.001 µF when the cell strings are independent and ~0.1 µF when the pack is connected to an external load. This 100:1 change in capacitance is sensed by the controller 104 as a change in an RC time constant.

Figure 3A:
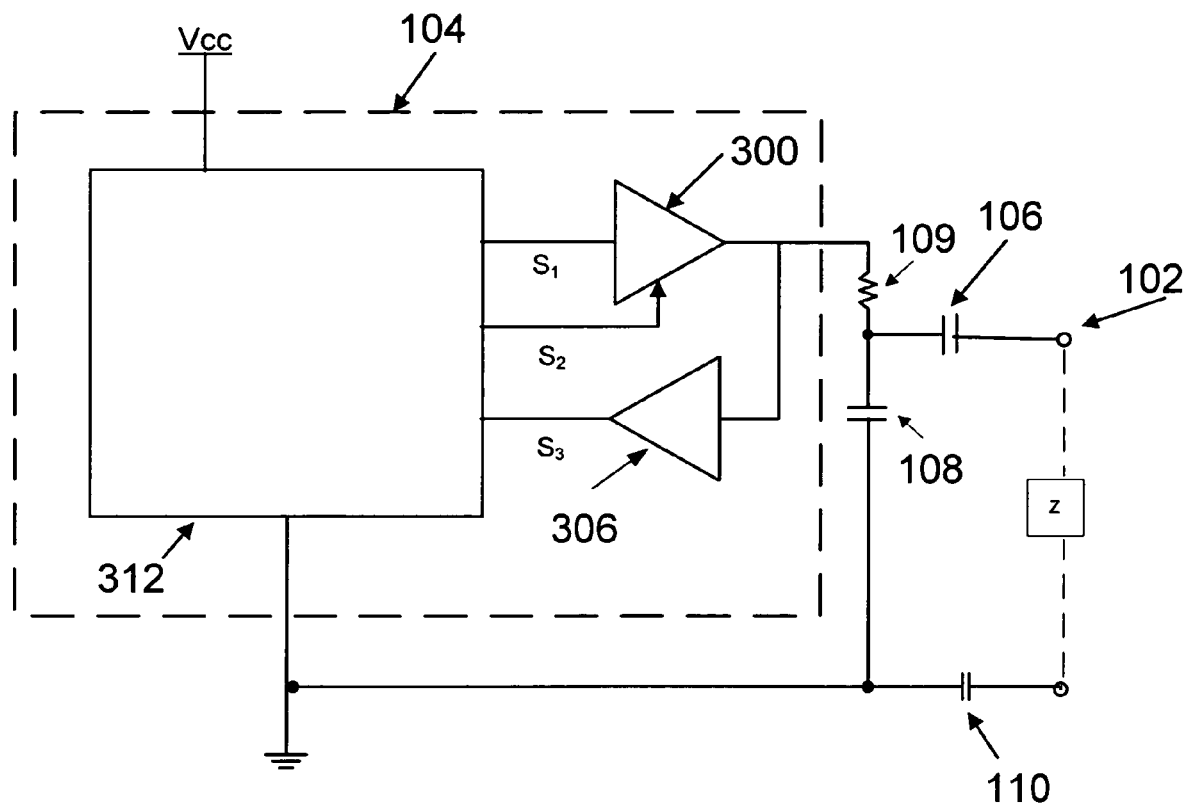
FIG. 3A illustrates a circuit diagram of a sensing circuit according to embodiments of the invention.
Figure 3B:
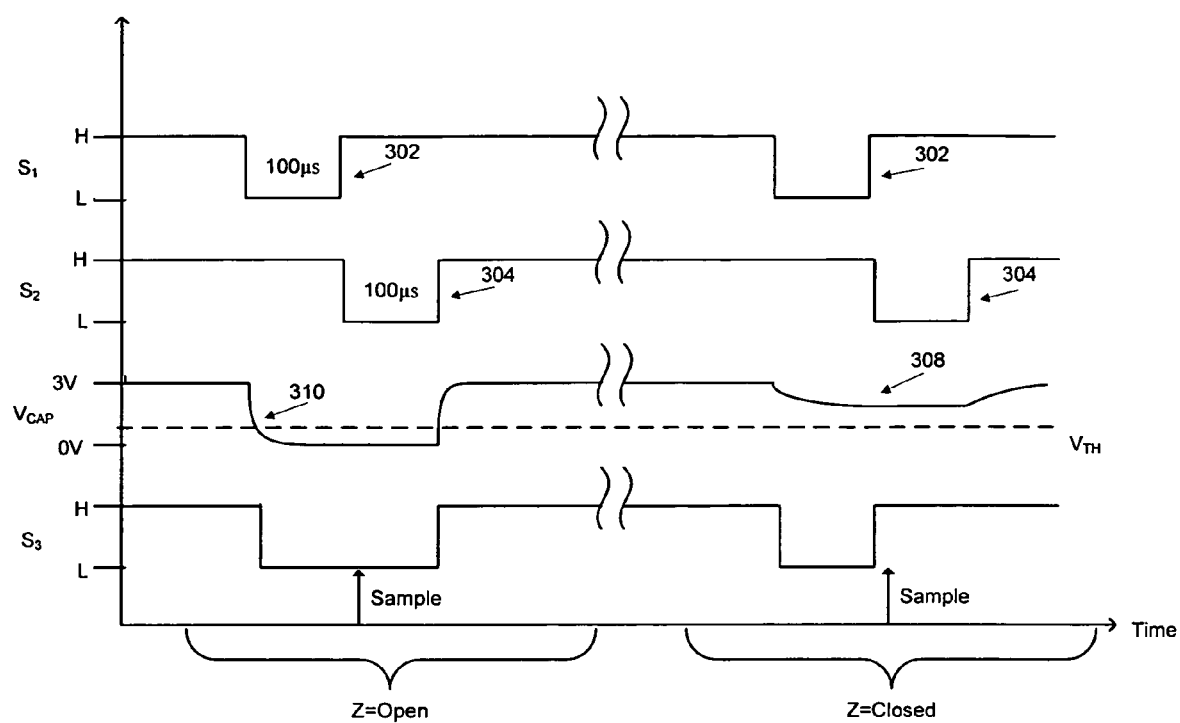
FIG. 3B illustrates a graphical diagram of the operation of the sensing circuit of FIG. 3A.

The functionality of the controller 104 may be implemented in a number of ways. For example, as illustrated in FIG. 3A, a pulse or step is generated by a tri-state CMOS logic gate 300, as controlled by timing circuit 312, and an output level is read at a time at which an output from two different time constants will be distinguishable. Thus, as illustrated in FIG. 3B, timing circuit 312 produces a pulse 302 which is applied by logic gate 300 to the RC circuit. After the pulse, the output of tri-state logic circuit 300 is opened as controlled by pulse 304. When the output is open, the voltage across the capacitor 108 appears on the input of gate 306 since no current is flowing through resistor 109 and is read through digitizing gate 306. Gate 306 produces one logic level when its input is below a threshold and a second logic level when its input is over a threshold. In one embodiment, each of the two logic levels from gate 306 select one of the two operating states of the SOC monitor, e.g., shelf or active state, respectively. By periodically repeating the measurement, a transition from unconnected mode to connected mode can be detected and the SOC monitor 208 can be activated. To enhance the robustness of the detection, the monitoring process can be repeated even after the first time that the change in mode is detected, and the SOC monitor 208 can be activated only when the change of mode is determined through a filtering process (e.g., change of mode is detected three out of five times or five times in a row, etc.). In one embodiment, a circuit may be employed to implement logical filtering and latching of the measurements to provide immunity to noise.

Note that FIG. 3A differs from FIG. 1 in providing optional capacitor 110 which can completely isolate controller 104 from the load connected across terminals 102 and 112 in a direct current (DC) sense. Also, note that only one logic connection connects CMOS controller 104 to the RC circuit.

The graph of FIG. 3B shows the sense level at the input of gate 306 versus time for each case, according to one embodiment of the invention. The logic threshold of ~1V is shown for 3V CMOS logic. The noise margin of ~1V at the sense point represents an immunity to about 10 nF of stray capacitance. Long decay curve 308 occurs when a load 212 is connected to the battery pack across terminals 102 and 112 and produces a high logic value at the output of gate 306 at the read point just after the first 100 µs pulse, indicating that the SOC monitor 308 should be in the active mode. Short decay curve 310 occurs when load 212 is not connected across terminals 102 and 112 and produces a low logic value at the output of gate 306 at the read point just after the first 100 µs pulse, indicating that the SOC monitor 308 should be in the sleep mode. This reading can be repeated about every 200 ms and is logically filtered before latching. For example, in one embodiment eight logic high readings may be required for an active mode determination. Voltage steps due to a connection between the battery pack and an external load will decay within 20ms and are therefore rejected by the logical filter.

In one embodiment, the SOC level of the battery pack is indicated visually by the SOC monitor on a multi-bar "thermometer" style display. For example, at least four bars are required assuming non-linear spaced levels of 100%, >70%, >40%, >10%. Alternately, any digital or analog display may be suitable for displaying the SOC level of the battery pack.

Therefore, the embodiments described herein reliably determine when to transition a SOC monitor from a first shelf mode, indicating that a monitored battery pack is not in use, to at least one second active mode, wherein the battery pack is electrically connected to an external load. Particularly, the SOC monitor employs a dormant mode, wherein little or no current is drawn, and may automatically sense via a sensing circuit when the battery pack is put in use to activate SOC monitoring.

Although the invention has been described in terms of various embodiments, it is not limited thereto. Rather, the appended claims should be construed broadly to include other variants and embodiments of the invention which may be made by those skilled in the art without departing from the scope and range of equivalents of the invention.

What is claimed is:

1. A method of detecting impedance across a pair of terminals comprising:
   AC coupling a sensing circuit to said pair of terminals, said sensing circuit producing an output related to a time constant associated with an impedance; and
   monitoring said sensing circuit output to determine said impedance.

2. The method of claim 1, wherein said sensing circuit output is monitored at a pre-selected time interval for comparison to a threshold to determine said time constant.

3. The method of claim 1, wherein said sensing circuit includes a CMOS logic device.

4. The method of claim 3, wherein one logic connection connects the CMOS logic device to a remainder of said sensing circuit.

5. The method of claim 1, wherein said sensing circuit is coupled to a battery pack; and said method further comprises:
   controlling an operating state of a state-of-charge monitor based on said monitoring.

6. The method of claim 5, wherein said battery pack includes a plurality of cell strings and when said plurality of cell strings are electrically independent, said sensing circuit produces first output.

7. The method of claim 6, wherein the current draw of said state-of-charge monitor is between 0 and about 10 µA when said sensing circuit produces said first output.

8. The method of claim 6, wherein said controlling further comprises activating said the state-of-charge monitor when said sensing circuit produces a second output.

9. The method of claim 8, wherein when said plurality of cell strings are electrically attached in series, said sensing circuit produces said second output.

10. The method of claim 8, wherein when said plurality of cell strings are electrically attached in parallel, said sensing circuit produces said second output.

11. The method of claim 5, further comprising indicating the state-of-charge level of said battery pack on a display.

12. The method of claim 11, wherein said display comprises a multiple bar indicator.

13. The method of claim 5, wherein said sensing circuit is contained within said state-of-charge monitor.

14. Apparatus for detecting an impedance across a pair of terminals comprising:
   a sensing circuit AC coupled to said terminals which produces an output related a to a time constant associated with said impedance.

15. The apparatus of claim 14 wherein said sensing circuit includes a CMOS logic device.

16. The apparatus of claim 15 wherein one logic connection connects said CMOS logic device to a remainder of said sensing circuit.

17. The apparatus of claim 14, further comprising:
   a state-of-charge detector having a plurality of operating states; wherein
   said sensing circuit is associated with a battery pack, produces an output based at least in part on whether said battery pack is connected to a load, and controls said operating states based on said sensing circuit output.

18. The state-of-charge monitor of claim 17, wherein said battery pack includes a plurality of cell strings and said sensing circuit is electrically attached to at least one or said plurality of cell strings.

19. The state-of-charge monitor in claim 17, wherein the current draw of said state-of-charge detector in a dormant mode is between 0 and about 10 µA.

20. A battery management system comprising:
   a battery pack having a plurality of cell strings;
   a state-of-charge monitor electrically attached to said battery pack and having a plurality of operating states; and
   a sensing circuit AC coupled to at least one of said plurality of cell strings which produces an output related to a time constant associated with an impedance between said plurality of cell strings, and controls said operating states based on said sensing circuit output.

21. The battery management system of claim 20, wherein when said plurality of cell strings are electrically independent, said sensing circuit produces a first output.

22. The battery management system of claim 21, wherein the current draw of said state-of charge monitor when said sensing circuit produces said first output is between 0 and about 10 µA.

23. The battery management system of claim 21, wherein said state-of-charge monitor is activated when said sensing circuit produces a second output.

24. The battery management system of claim 23, wherein when said plurality of cell strings are electrically attached in series, said sensing circuit produces said second output.

25. The battery management system of claim 23, wherein when said plurality of cell strings are electrically attached in parallel, said sensing circuit produces said second output.

26. The battery management system of claim 20, wherein said sensing circuit output is monitored at a pre-selected time interval for comparison to a threshold to determine said time constant.

27. The battery management system of Saint 20, further comprising a display for indicating the state-of-charge level of said battery pack to a user.

28. The battery management system of claim 27, wherein said display comprises a multiple bar indicator.

29. The battery management system of claim 20, wherein said sensing circuit is integrated within said state-of-charge monitor.

30. The battery management system of claim 20, wherein said sensing circuit includes a CMOS logic device.

31. The battery management system of claim 30, wherein one logic connection connects the CMOS logic device to said battery pack.

* * * * *